(12) United States Patent
Shiozawa et al.

(10) Patent No.: US 11,848,189 B2
(45) Date of Patent: Dec. 19, 2023

(54) SUBSTRATE PROCESSING METHOD, RECORDING MEDIUM AND SUBSTRATE PROCESSING APPARATUS

(71) Applicant: Tokyo Electron Limited, Tokyo (JP)

(72) Inventors: Takahiro Shiozawa, Koshi (JP); Hiroki Tadatomo, Koshi (JP); Akiko Kai, Koshi (JP); Hiroshi Ichinomiya, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 375 days.

(21) Appl. No.: 17/009,834

(22) Filed: Sep. 2, 2020

(65) Prior Publication Data

US 2021/0066097 A1 Mar. 4, 2021

(30) Foreign Application Priority Data

Sep. 3, 2019 (JP) .................. 2019-160559

(51) Int. Cl.
| | | |
|---|---|---|
| H01L 21/06 | (2006.01) |
| H01L 21/027 | (2006.01) |
| H01L 21/687 | (2006.01) |
| H01L 21/67 | (2006.01) |

(52) U.S. Cl.
CPC ...... H01L 21/67028 (2013.01); H01L 21/027 (2013.01); H01L 21/6715 (2013.01); H01L 21/68764 (2013.01)

(58) Field of Classification Search
CPC ............ H01L 21/67028; H01L 21/027; H01L 21/6715; H01L 21/68764; H01L 21/0273; H01L 21/67051; H01L 21/0271; H01L 21/67034; H01L 21/6704; H01L 21/02057; H01L 21/0274; B08B 3/02; G03F 7/3021; G03F 7/3057
See application file for complete search history.

(56) References Cited

U.S. PATENT DOCUMENTS

| | | | |
|---|---|---|---|
| 2004/0112409 A1* | 6/2004 | Schilling | ............... B08B 7/0021 134/201 |
| 2012/0077132 A1* | 3/2012 | Quillen | ............. H01L 21/02057 430/329 |
| 2018/0005840 A1* | 1/2018 | Liu | .................. H01L 21/67051 |
| 2020/0064742 A1 | 2/2020 | Kai et al. | |
| 2021/0063885 A1* | 3/2021 | Kai | ......................... G03F 7/405 |

FOREIGN PATENT DOCUMENTS

WO 2018/116985 A1 6/2018

* cited by examiner

*Primary Examiner* — Alexander Markoff
(74) *Attorney, Agent, or Firm* — Pearne & Gordon LLP

(57) ABSTRACT

A substrate processing method includes supplying a developing liquid configured to form a resist pattern onto a surface of a substrate on which a resist film is formed; performing multiple cycles of a cleaning processing of supplying a modifying liquid containing a modifying agent having a hydrophilic group onto the surface of the substrate on which the resist pattern is formed and supplying a rinse liquid configured to remove the modifying liquid onto the surface of the substrate; and drying the surface of the substrate after performing the multiple cycles of the cleaning processing.

10 Claims, 11 Drawing Sheets

SUBSTRATE PROCESSING METHOD, RECORDING MEDIUM AND SUBSTRATE PROCESSING APPARATUS

CROSS-REFERENCE TO RELATED APPLICATION

This application claims the benefit of Japanese Patent Application No. 2019-160559 filed on Sep. 3, 2019, the entire disclosure of which is incorporated herein by reference.

TECHNICAL FIELD

The various aspects and embodiments described herein pertain generally to a substrate processing method, a recording medium and a substrate processing apparatus.

BACKGROUND

Patent Document 1 describes a method (substrate processing method) of developing a resist film on a substrate. This substrate processing method includes a process of forming a resist pattern on the substrate by supplying a developing liquid, a process of coating an aqueous solution of a water-soluble polymer on the developed substrate, and a process of cleaning the substrate by supplying a rinse liquid onto the substrate on which the aqueous solution is coated.

Patent Document 1: International Publication No. 2018/116985

SUMMARY

In one exemplary embodiment, a substrate processing method includes supplying a developing liquid configured to form a resist pattern onto a surface of a substrate on which a resist film is formed; performing multiple cycles of a cleaning processing of supplying a modifying liquid containing a modifying agent having a hydrophilic group onto the surface of the substrate on which the resist pattern is formed and supplying a rinse liquid configured to remove the modifying liquid onto the surface of the substrate; and drying the surface of the substrate after performing the multiple cycles of the cleaning processing.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 10A and FIG. 1013 are schematic diagrams for describing a removal of the modifying liquid in the cleaning processing sequence.

DETAILED DESCRIPTION

Figure 1:
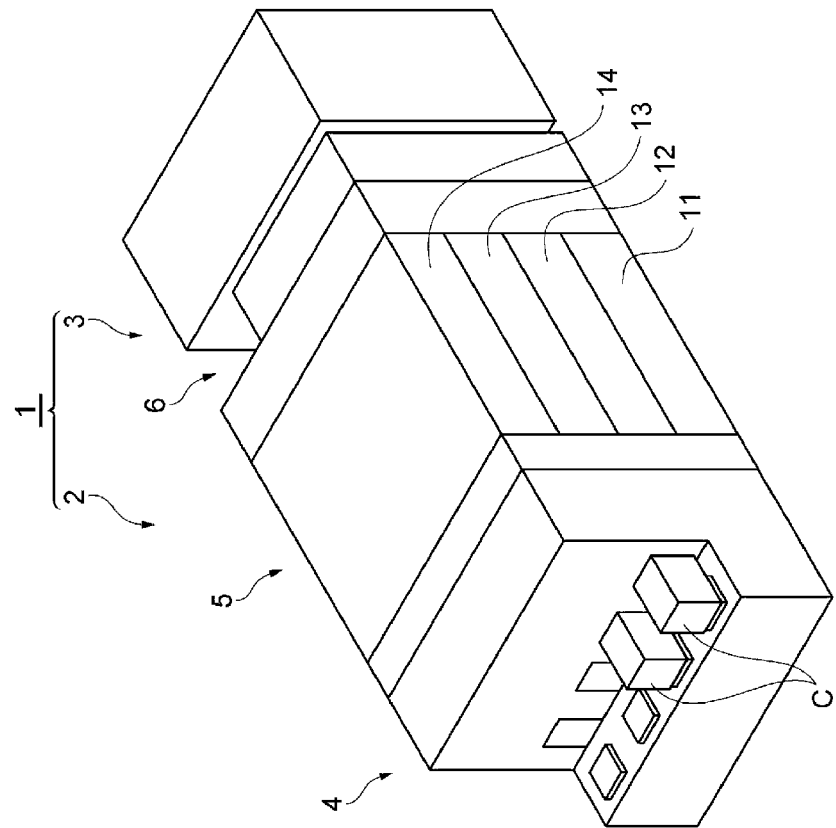
FIG. 1 is a schematic diagram illustrating an example of a schematic configuration of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment will be described in detail with reference to the accompanying drawings. In the following description, same parts or parts having same functions will be assigned same reference numerals, and redundant description will be omitted.

[Substrate Processing System]

First, a schematic configuration of a substrate processing system 1 (substrate processing apparatus) will be explained with reference to FIG. 1 and FIG. 2. The substrate processing system 1 is a system configured to perform formation of a photosensitive film, exposure of the photosensitive film and development of the photosensitive film. The substrate as a processing target object is, for example, a semiconductor wafer W. The photosensitive film is, by way of non-limiting example, a resist film. The substrate processing system 1 includes a coating and developing apparatus 2, an exposure apparatus 3, and a control device 100. The exposure apparatus 3 is configured to perform an exposure processing for the resist film (photosensitive film) formed on the wafer W (substrate). To elaborate, the exposure apparatus 3 irradiates an energy beam to an exposure target portion of the resist film by an immersion exposure method or the like. The coating and developing apparatus 2 is configured to perform a processing of forming the resist film by coating the resist (chemical liquid) on a surface of the wafer W (substrate) prior to the exposure processing by the exposure apparatus 3. Further, the coating and developing apparatus 2 performs a developing processing on the resist film after the exposure processing.

[Coating and Developing Apparatus]

Figure 2:
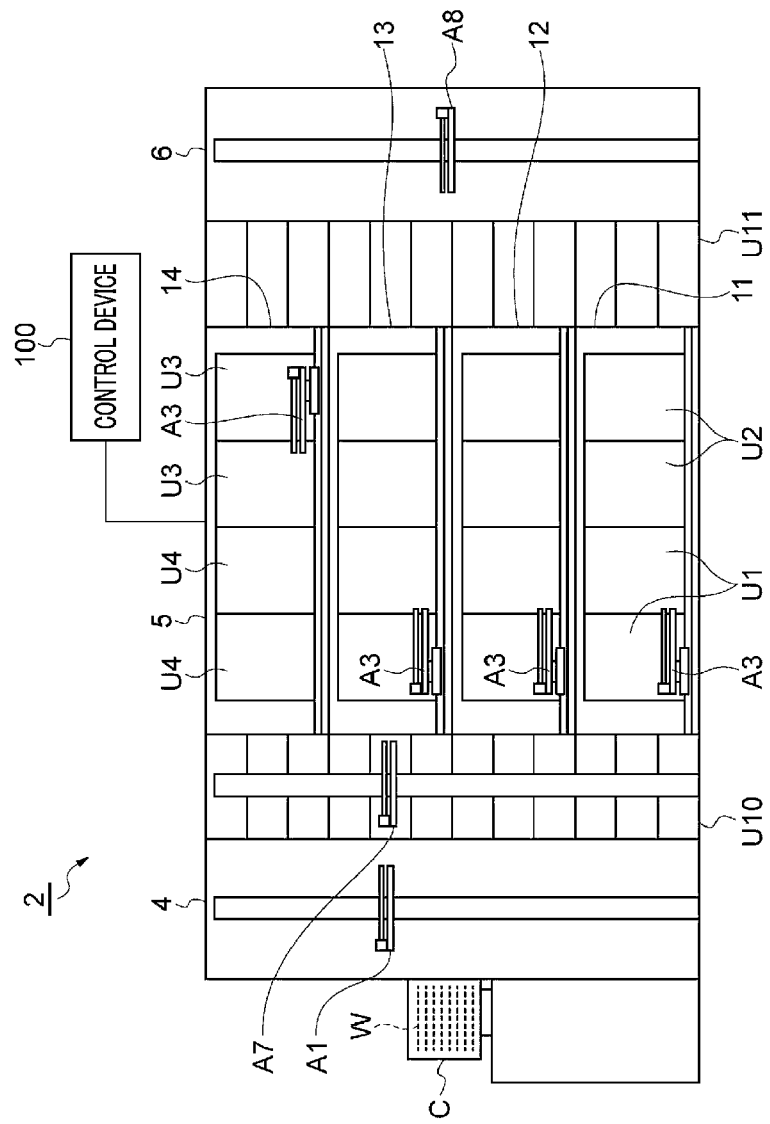
FIG. 2 is a schematic diagram illustrating an example of an internal configuration of a coating and developing apparatus.

As depicted in FIG. 1 and FIG. 2, the coating and developing apparatus 2 (substrate processing apparatus) is equipped with a carrier block 4, a processing block 5, and an interface block 6.

The carrier block 4 is configured to carry a wafer W into/from the coating and developing apparatus 2. For example, the carrier block 4 is configured to support a plurality of carriers C for wafers W and incorporates therein a transfer device A1 including a delivery arm. Each carrier C accommodates therein, for example, a multiple number of circular wafers W. The transfer device A1 is configured to take out a wafer W from the carrier C, hand the wafer W over to the processing block 5, receive the wafer W from the processing block 5 and return the wafer W back into the carrier C. The processing block 5 includes a multiple number of processing modules 11, 12, 13 and 14.

The processing module 11 incorporates therein a coating unit U1, a heat treatment unit U2 and a transfer device A3 configured to transfer the wafer W into these units. The processing module 11 is configured to form a bottom film on a surface of the wafer W by the coating unit U1 and the heat treatment unit U2. The coating unit U1 is configured to coat a processing liquid for forming the bottom film on the wafer W. The heat treatment unit U2 is configured to perform various kinds of heat treatments required to form the bottom film. The bottom film may be, by way of non-limiting example, a SOG (Spin On Glass) having $SiO_2$ as a main component, a SiARC (Silicon-containing Anti-Reflective Coating), or the like.

The processing module 12 incorporates therein a coating unit U1, a heat treatment unit U2 and a transfer device A3 configured to transfer the wafer W into these units. The processing module 12 is configured to form a resist film on the bottom film by the coating unit U1 and the heat treatment unit U2. The coating unit U1 is configured to coat resist on the bottom film as a processing liquid for forming the resist film. The heat treatment unit U2 is configured to perform various kinds of heat treatments required to form the resist film. Accordingly, the resist film is formed on the surface of the wafer.

The processing module 13 incorporates therein a coating unit U1, a heat treatment unit U2, and a transfer device A3 configured to transfer the wafer W into these units. The processing module 13 is configured to form a top film on the resist film by the coating unit U1 and the heat treatment unit U2. The coating unit U1 is configured to coat a processing liquid for forming the top film on the resist film. The heat treatment unit U2 is configured to perform various kinds of heat treatments required to form the top film.

The processing module 14 incorporates therein a developing unit U3, a heat treatment unit U4, and a transfer device A3 configured to transfer the wafer W into these units. The processing module 14 is configured to perform a developing processing on the exposed resist film by the developing unit U3 and the heat treatment unit U4. The developing unit U3 is configured to coat a developing liquid on the surface of the exposed wafer W. Further, the developing unit U3 is also configured to perform a rinsing processing of washing the coated developing liquid with a rinse liquid or the like. Details of the rinsing processing will be elaborated later. The heat treatment unit U4 is configured to perform various kinds of heat treatments required for the developing processing. Specific examples of these heat treatments involved in the developing processing include a heat treatment (PEB: Post Exposure Bake) before developing, a heat treatment (PB: Post Bake) after developing, and so forth.

Within the processing block 5, a shelf unit U10 is provided near the carrier block 4. The shelf unit U10 is partitioned into a multiple number of cells arranged in a vertical direction. A transfer device A7 including an elevating arm is provided in the vicinity of the shelf unit 10. The transfer device A7 is configured to move the wafer W up and down between the cells of the shelf unit U10.

Within the processing block 5, a shelf unit U11 is provided near the interface block 6. The shelf unit U11 is partitioned into a multiple number of cells arranged in the vertical direction.

The interface block 6 is configured to deliver the wafer W to/from the exposure apparatus 3. By way of example, the interface block 6 incorporates therein a transfer device A8 including a delivery arm and is connected to the exposure apparatus 3. The transfer device A8 is configured to deliver the wafer W placed in the shelf unit U11 to the exposure apparatus 3. The transfer device A8 is also configured to receive the wafer W from the exposure apparatus 3 and return the received wafer W back into the shelf unit U11.

(Developing Unit)

Figure 3:
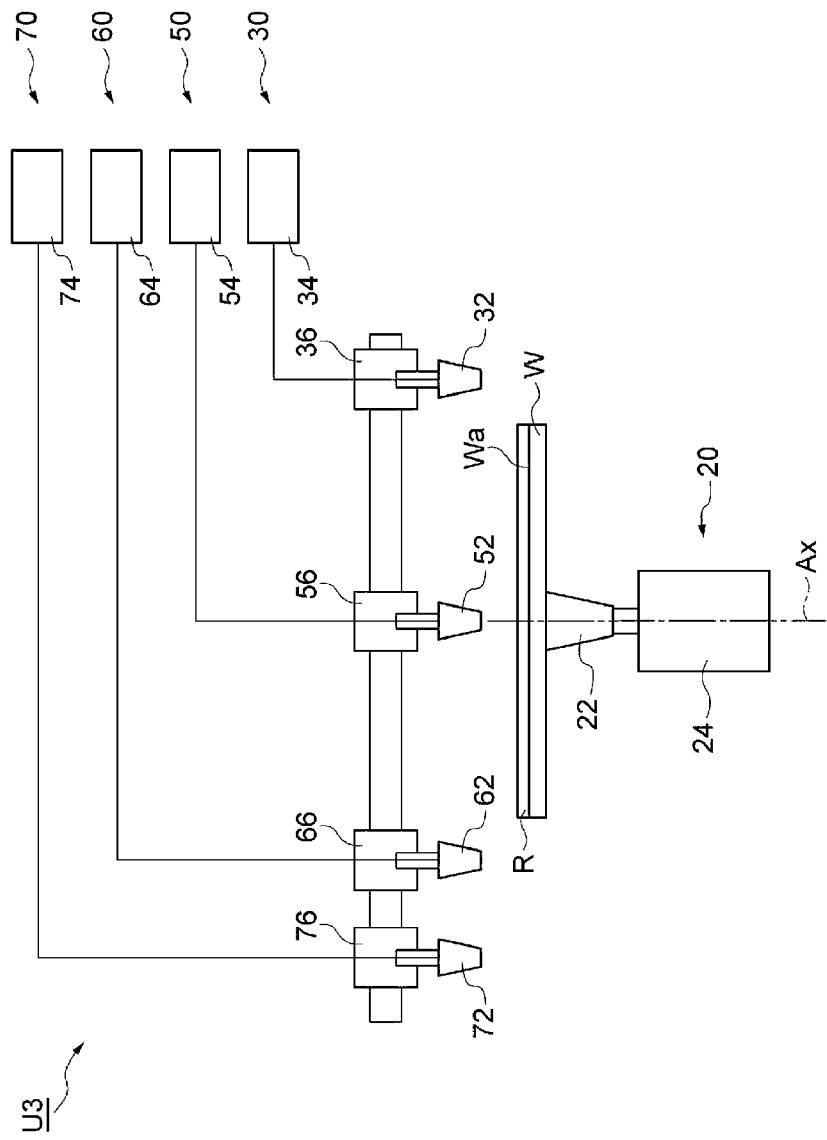
FIG. 3 is a schematic diagram illustrating an example configuration of a developing unit.

Now, referring to FIG. 3, an example of the developing unit U3 will be explained. As depicted in FIG. 3, the developing unit U3 includes, by way of non-limiting example, a rotating holder 20, a developing liquid supply 30, a modifying liquid supply 50, a rinse liquid supply 60, and a solution supply 70.

The rotating holder 20 is configured to hold and rotate the wafer W. By way of example, the rotating holder 20 is equipped with a holder 22 and a rotation driving unit 24. The holder 22 is configured to support a central portion of the wafer W, which is horizontally placed thereon with a front surface Wa facing upwards, and hold the wafer W by, for example, vacuum attraction or the like. The rotation driving unit 24 is an actuator using, for example, an electric motor as a power source, and is configured to rotate the holder 22 around a vertical axis Ax. Accordingly, the wafer W on the holder 22 is rotated. The holder 22 may be configured to hold the wafer W such that a center of the wafer W lies on the vertical axis Ax approximately.

The developing liquid supply 30 is configured to supply a developing liquid (hereinafter, referred to as "developing liquid L1") onto the front surface Wa of the wafer W on which a resist film R is formed. The developing liquid L1 is a solution for forming a resist pattern. By way of example, a solution containing tetramethyl ammonium hydroxide (TMAH) may be used as the developing liquid L1. The developing liquid supply 30 may be equipped with a nozzle 32, a supply source 34, and a nozzle moving mechanism 36. The nozzle 32 is configured to discharge the developing liquid L1 onto the front surface Wa of the wafer W. By way of example, the nozzle 32 is disposed above the wafer W and discharges the developing liquid L1 downwards. The supply source 34 is configured to supply the developing liquid L1 to the nozzle 32 by a pump or the like (not shown). The nozzle moving mechanism 36 is configured to move the nozzle 32 between a discharge position above the wafer W and a retreat position far from the discharge position by using an electric motor or the like as a power source. The discharge position is, by way of non-limiting example, a position vertically above a rotation center of the wafer W. Accordingly, the developing liquid L1 is supplied onto the center (rotation center) of the wafer W.

The modifying liquid supply 50 is configured to supply a modifying liquid (hereinafter, referred to as "modifying liquid L2") onto the front surface Wa of the wafer W on which the resist pattern is formed. The modifying liquid L2 is a solution configured to modify a surface of the resist pattern. In the present exemplary embodiment, the modifying of the surface means hydrophilizing the surface (reducing a contact angle). The modifying liquid contains a modifying agent having a hydrophilic group. A hydroxyl group (OH group) may be an example of the hydrophilic group. The modifying agent may contain a water-soluble polymer. The water-soluble polymer may be a homopolymer or copolymer of a monomer including a hydrophilic group, or a condensation polymer having a hydrophilic group.

As a specific example, the water-soluble polymer may be acrylic acid, methacrylic acid, fluoroacrylic acid, perfluoroalkyl acid, vinyl alcohol, vinylpyrrolidone, acrylic acid ester, methacrylic acid ester, polyvinyl alcohol (including a partially saponified material), polyacrylic acid, polymethacrylic acid, polyvinyl methyl ether, polyvinyl pyrrolidone, polyethylene glycol, polyvinyl acetal (including partially acetalized material), polyethyleneimine, polyethylene oxide, styrene-maleic anhydride copolymer, polyvinylamine, polyarylamine, a water-soluble oxazoline-functional resin, a water-soluble melamine resin, a water-soluble urea resin, an alkyd resin or a sulfonamide, or salts made by these materials. Further, polyglycerin may be used as the water-soluble polymer. These water-soluble polymers may be used individually, or two or more of them may be used in combinations. A concentration of the modifying agent (water-soluble polymer) in the modifying liquid L2 may be less than 10% or less than 5%. A surfactant may be added to the modifying liquid L2. A concentration of the surfactant may be less than 5%. The modifying liquid L2 may be acidic, and a pH of the modifying liquid L2 may range from, e.g., 3 to 6.

The modifying liquid supply 50 may be equipped with a nozzle 52 (modifying liquid nozzle), a supply source 54, and a nozzle moving mechanism 56. The nozzle 52 is configured to discharge the modifying liquid L2 onto the front surface Wa of the wafer W. By way of example, the nozzle 52 is disposed above the wafer W and discharges the modifying liquid L2 downwards. The supply source 54 is configured to supply the modifying liquid L2 to the nozzle 52 by a pump or the like (not shown). The nozzle moving mechanism 56 is configured to move the nozzle 52 between a discharge position above the wafer W and a retreat position far from the discharge position by using an electric motor or the like as a power source. The discharge position is, for example, a position vertically above the rotation center of the wafer W. Accordingly, the modifying liquid L2 is supplied to the center (rotation center) of the wafer W.

The rinse liquid supply 60 may be configured to supply a rinse liquid (hereinafter, referred to as "rinse liquid L3") onto the front surface Wa of the wafer W on which the developing liquid L1 is supplied. The rinse liquid supply 60 is configured to supply the rinse liquid L3 onto the front surface Wa of the wafer W on which the modifying liquid L2 is supplied. The rinse liquid L3 is a solution for removing the modifying liquid L2 (developing liquid L1) on the front surface Wa. Further, the removing of the modifying liquid L2 (developing liquid L1) includes replacing the modifying liquid L2 (developing liquid L1) on the front surface Wa with the rinse liquid L3. The rinse liquid L3 is, for example, a water-based cleaning liquid. As an example, the rinse liquid L3 is pure water, and DIW (Deionized Water) may be used as the rinse liquid L3.

The rinse liquid supply 60 may be equipped with a nozzle 62 (rinse liquid nozzle), a supply source 64, and a nozzle moving mechanism 66. The nozzle 62 is configured to discharge the rinse liquid L3 onto the front surface Wa of the wafer W. By way of example, the nozzle 62 is disposed above the wafer W and discharges the rinse liquid L3 downwards. The supply source 64 is configured to supply the rinse liquid L3 to the nozzle 62 by a pump or the like (not shown). The nozzle moving mechanism 66 is configured to move the nozzle 62 between a discharge position above the wafer W and a retreat position far from the discharge position by using an electric motor or the like as a power source. For example, the discharge position is a position vertically above the rotation center of the wafer W. Accordingly, the rinse liquid L3 is supplied onto the center (rotation center) of the wafer W.

The solution supply 70 is configured to supply a solution (hereinafter, referred to as "solution L4") containing a surfactant onto the front surface Wa of the wafer W. Through the supply of the solution L4, the solution supply 70 replaces the rinse liquid L3 on the front surface Wa with the solution L4. By way of example, the surfactant included in the solution L4 may be, by way of example, sorbitan monooleate, glycerol α-monooleate, polyethylene glycol sorbitan fatty acid ester, polyethylene glycol linear alkyl ether, polyethylene glycol phenyl ether straight-chain alkyl addition type, branched-chain alkyl addition type, acetylene glycol, anionic sodium laurate, sodium stearate, sodium oleate, sodium dodecyl sulfate, sodium dodecylbenzenesulfonate, or the like. These surfactants may be used individually, or two or more of them may be used in combinations. A concentration of the surfactant in the solution L4 may be less than 5%.

The solution supply 70 may be equipped with a nozzle 72, a supply source 74, and a nozzle moving mechanism 76. The nozzle 72 is configured to discharge the solution L4 onto the front surface Wa of the wafer W. By way of example, the nozzle 72 is disposed above the wafer W and discharges the solution L4 downwards. The supply source 64 is configured to supply the solution L4 to the nozzle 72 by a pump or the like (not shown). The nozzle moving mechanism 76 is configured to move the nozzle 72 between a discharge position above the wafer W and a retreat position far from the discharge position by using an electric motor or the like as a power source. The discharge position is, for example, a position vertically above the rotation center of the wafer W. Accordingly, the solution L4 is supplied onto the center (rotation center) of the wafer W.

(Control Device)

Now, a specific configuration of the control device 100 will be explained. The control device 100 is configured to control the coating and developing apparatus 2 partially or in overall. The control device 100 is configured to supply the developing liquid L1 onto the front surface Wa of the wafer W by the developing liquid supply 30 in the state that the wafer W is held by the holder 22; perform multiple cycles of a cleaning processing of supplying the modifying liquid L2 onto the front surface Wa of the wafer W by the modifying liquid supply 50 and supplying the rinse liquid L3 onto the front surface Wa of the wafer W by the rinse liquid supply 60 in the state that the wafer W is held by the holder 22; and allow the holder 22 to carry on the holding of the wafer W after the multiple cycles of the cleaning processing is performed, to thereby dry the front surface Wa of the wafer W.

Figure 4:
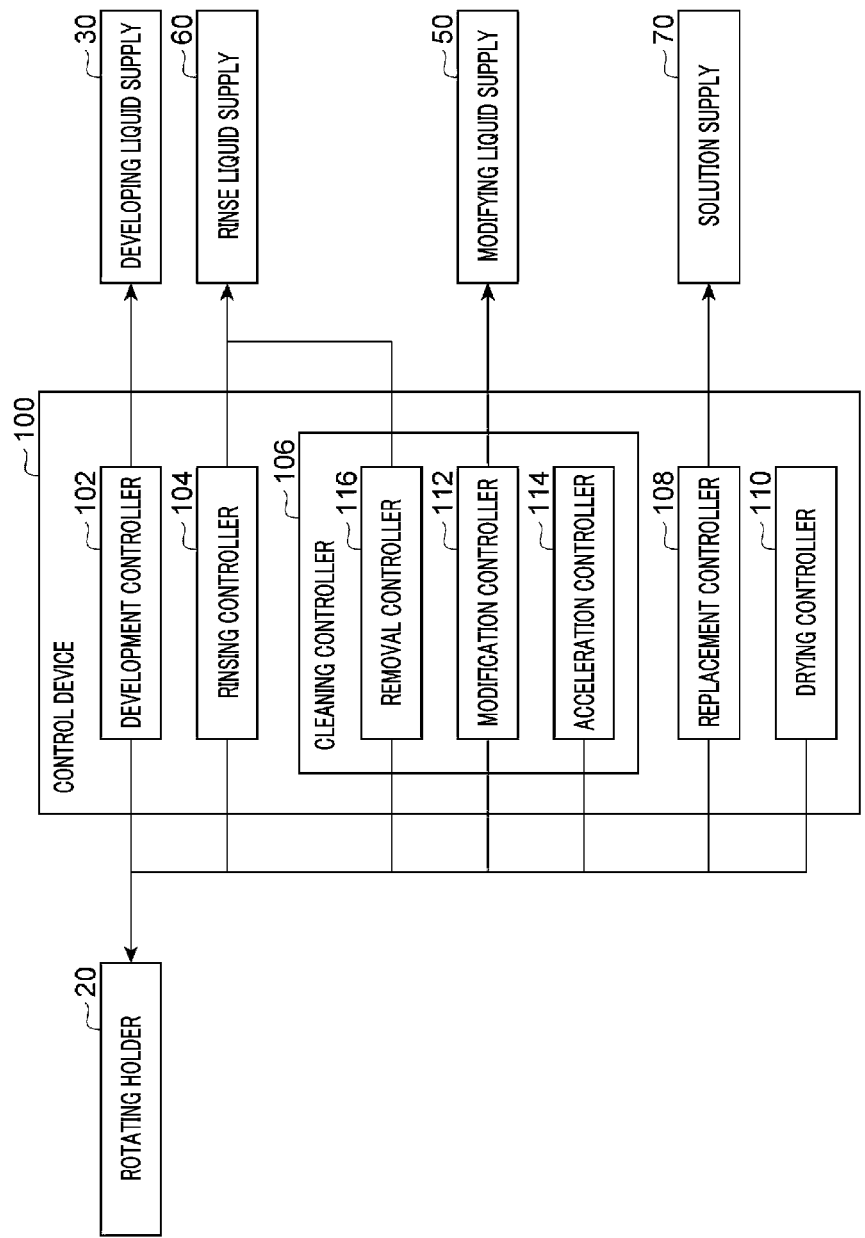
FIG. 4 is a block diagram illustrating an example functional configuration of a control device.

As depicted in FIG. 4, the control device 100 includes, as functional components (hereinafter, referred to as "functional modules"), a development controller 102, a rinsing controller 104, a cleaning controller 106, a replacement controller 108, and a drying controller 110.

The development controller 102 controls the developing liquid supply 30 to supply the developing liquid L1 onto the front surface Wa of the wafer W in the state that the wafer W having the resist film R formed thereon is held by the holder 22. By way of example, the development controller 102 controls the nozzle moving mechanism 36 to locate the nozzle 32 of the developing liquid supply 30 on the axis Ax (discharge position). The development controller 102 controls the developing liquid supply 30 to discharge the developing liquid L1 toward the resist film R from the nozzle 32 on the axis Ax while rotating the wafer W by the rotating holder 20. To maintain a liquid film of the developing liquid L1 formed on the front surface Wa of the wafer W on which the developing liquid L1 is supplied, the development controller 102 allows the wafer W to be held by the holder 22 (rotating holder 20) in the state that the wafer W is stopped.

The rinsing controller 104 may control the rinse liquid supply 60 to supply the rinse liquid L3 onto the front surface Wa of the wafer W to remove the developing liquid L1 on the front surface Wa of the wafer W on which the resist pattern is formed. The rinsing controller 104 controls the nozzle moving mechanism 66 to locate the nozzle 62 of the rinse liquid supply 60 on the axis Ax. The rinsing controller 104 controls the rinse liquid supply 60 to supply the rinse liquid L3 onto the front surface Wa of the wafer W from the nozzle 62 on the axis Ax while rotating the wafer W by the rotating holder 20. The rinsing controller 104 controls a rotation speed of the wafer W while supplying the rinse liquid L3 so that the developing liquid L1 on the wafer W is replaced by the rinse liquid L3.

Figure 5:
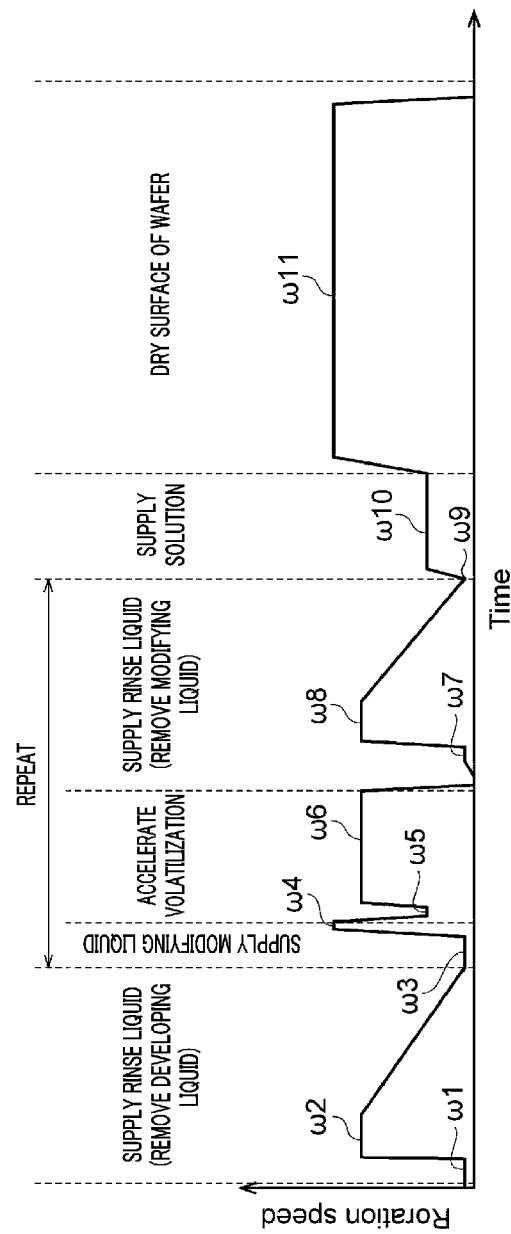
FIG. 5 is a graph showing an example control over a rotation speed in a developing processing.

As an example, the rinsing controller 104 controls the rinse liquid supply 60 to start the supply of the rinse liquid L3 in the state that the wafer W is rotated at a rotation speed $\omega 1$ by the rotating holder 20, as illustrated in FIG. 5. After the supply of the rinse liquid L3 is begun, the rinsing controller 104 controls the rinse liquid supply 60 to carry on the supply of the rinse liquid L3 in the state that the rotation speed of the wafer W is increased from the rotation speed $\omega 1$ to a rotation speed $\omega 2$. During this supply of the rinse liquid L3, the rinsing controller 104 controls the rotating holder 20 to decrease the rotation speed of the wafer W from the rotation speed $\omega 2$ to a rotation speed $\omega 3$ slowly. The rinsing controller 104 controls the rinse liquid supply 60 to stop the supply of the rinse liquid L3 when the rotation speed of the wafer W reaches the rotation speed $\omega 3$. The rinse liquid L3 supplied from the rinse liquid supply 60 is diffused onto the front surface Wa of the wafer W due to the rotation of the wafer W by the rotating holder 20.

The rotation speed $\omega 1$ is set to be a low speed which involves a small effect of rotation upon a lump of the liquid reaching the front surface Wa of the wafer W at the start of the supply of the rinse liquid L3. As an example, the rotation speed $\omega 1$ is set to be in a range from about 20 rpm to about 200 rpm. The rotation speed $\omega 1$ may be in a range from about 50 rpm to about 150 rpm or about 80 rpm to about 120 rpm. The rotation speed $\omega 2$ is set to be of a value which allows the rinse liquid L3 having reached the front surface Wa of the wafer W to be diffused to a periphery of the wafer W. As an example, the rotation speed $\omega 2$ is in a range from about 1000 rpm to about 1400 rpm. The rotation speed $\omega 2$ may be in a range from about 1100 rpm to 1300 rpm or about 1150 rpm to 1250 rpm. The rotation speed $\omega 3$ is set in consideration of a processing performed after the end of the supply of the rinse liquid L3. The rotation speed $\omega 3$ may be equal to the rotation speed $\omega 1$.

The cleaning controller 106 performs multiple cycles of the cleaning processing. In the cleaning processing, the cleaning controller 106 controls the modifying liquid supply 50 to supply the modifying liquid L2 onto the front surface Wa of the wafer W and controls the rinse liquid supply 60 to supply the rinse liquid L3 in the state that the wafer W is held by the holder 22. In at least one of the multiple cycles of the cleaning processing, before the supply of the rinse liquid L3 and after the modifying liquid L2 is supplied onto the front surface Wa of the wafer W, the cleaning controller 106 may control the developing unit U3 to increase a concentration of the modifying agent in the modifying liquid L2 which is supplied on the front surface Wa. By way of example, the cleaning controller 106 controls the developing unit U3 to accelerate volatilization of a solvent of the modifying liquid L2 supplied on the front surface Wa.

In the multiple cleaning processings, the cleaning controller 106 may supply the modifying liquid L2 from the same nozzle 52 and supply the rinse liquid L3 from the same nozzle 62. By way of example, when the cleaning processing is performed twice, the cleaning controller 106 supplies the modifying liquid L2 (rinse liquid L3) onto the wafer W by using the same nozzle 52 (nozzle 62) in both the first cycle of the cleaning processing and the second cycle of the cleaning processing. Further, the cleaning controller 106 performs the multiple cycles of the cleaning processings in the state that the wafer W is placed at the same position. By way of example, the cleaning controller 106 may perform the cleaning processing repeatedly in the state that the wafer W is held by the same rotating holder 20 (holder 22) within the developing unit U3. The cleaning controller 106 includes, by way of example, a modification controller 112, an acceleration controller 114, and a removal controller 116.

The modification controller 112 controls the nozzle moving mechanism 56 to locate the nozzle 52 of the modifying liquid supply 50 on the axis Ax in the cleaning processing. The modification controller 112 controls the modifying liquid supply 50 to supply the modifying liquid L2 onto the front surface Wa of the wafer W from the nozzle 52 on the axis Ax (discharge position) while rotating the wafer W by the rotating holder 20. The modification controller 112 adjusts the rotation speed of the wafer W while supplying the modifying liquid L2 so that the rinse liquid L3 on the wafer W is replaced by the modifying liquid L2. The modification controller 112 controls the modifying liquid supply 50 to start the supply of the modifying liquid L2 in the state that the wafer W is rotated by the rotating holder 20 at the rotation speed $\omega 3$, as shown in FIG. 5. After the start of the supply of the modifying liquid L2, the modification controller 112 controls the modifying liquid supply 50 to carry on the supply of the modifying liquid L2 while increasing the rotation speed of the wafer W to a rotation speed $\omega 4$ which is higher than the rotation speed $\omega 3$. The rotation speed $\omega 4$ is set to be of a value which allows the modifying liquid L2 having reached the front surface Wa of the wafer W to be diffused to the periphery of the wafer W. The rotation speed $\omega 4$ may be larger than the rotation speed $\omega 2$. As an example, the rotation speed $\omega 4$ may be in a range from about 1300 rpm to 1700 rpm. The rotation speed $\omega 4$ may be in a range from about 1400 rpm to about 1600 rpm or about 1450 rpm to about 1550 rpm.

In the multiple cycles of the cleaning processings, the modification controller 112 may supply the modifying liquid L2 from the nozzle 52 at the same flow rate or may supply the modifying liquid L2 from the nozzle 52 for the same supply time. The modification controller 112 may vary at least one of the flow rate or the supply time in any one of the second or more cycles of the cleaning processing. By way of example, the modification controller 112 may decrease at least one of the flow rate or the supply time in any one of the second or more cycles of the cleaning processing, as compared to those in the first cleaning processing. Furthermore, if the developing unit U3 has a nozzle for the modifying liquid different from the nozzle 52, the modification controller 112 may supply the modifying liquid L2 from the different nozzles in the multiple cycles of the cleaning processings.

The acceleration controller 114 is configured to increase the concentration of the modifying agent in the modifying liquid L2 by accelerating the volatilization of the solvent in the modifying liquid L2 on the front surface Wa in at least one cycle of the cleaning processing. By way of example, in the corresponding cleaning processing, the acceleration controller 114 accelerates the volatilization of the solvent of the modifying liquid L2 by controlling the rotating holder 20 to rotate the wafer W in the state that no liquid is supplied thereto. As an example, the acceleration controller 114 accelerates the volatilization of the solvent to the extent that the concentration of the modifying liquid L2 is increased even though the solvent in the modifying liquid L2 still remains. A time during which the acceleration controller 114 rotates the wafer W to accelerate the volatilization of the solvent may be longer than a time during which the modification controller 112 supplies the modifying liquid L2.

By way of example, after the supply of the modifying liquid L2 is stopped, the acceleration controller 114 controls the rotating holder 20 to decrease the rotation speed of the wafer W from the rotation speed ω4 to a rotation speed ω5 and to increase the rotation speed of the wafer W from the rotation speed ω5 to a sixth rotation speed ω6, as illustrated in FIG. 5. As an example, the rotation speed ω5 may be in a range from about 300 rpm to about 700 rpm. The rotation speed ω5 may be in a range from about 400 rpm to 600 rpm or in a range from about 450 rpm to 550 rpm. The rotation speed ω6 is set to allow the solvent of the modifying liquid L2 on the front surface Wa to be left. By way of example, the rotation speed ω6 may be equal to the rotation speed ω2. Further, instead of rotating the wafer W, the acceleration controller 114 may increase the concentration of the modifying agent by supplying the modifying agent into the modifying liquid L2 after the modifying liquid L2 is diffused onto the substantially entire surface of the wafer W. Alternatively, the acceleration controller 114 may volatilize the solvent by heating the modifying liquid L2 on the front surface Wa.

In the cleaning processing, the removal controller 116 is configured to control the nozzle moving mechanism 66 to locate the nozzle 62 of the rinse liquid supply 60 on the axis Ax. The removal controller 116 controls the rinse liquid supply 60 to supply the rinse liquid L3 onto the front surface Wa of the wafer W from the nozzle 62 on the axis Ax while rotating the wafer W by the rotating holder 20. By way of example, the removal controller 116 controls the rinse liquid supply 60 to start the supply of the rinse liquid L3 in the state that the rotation speed is set to be zero by controlling the rotating holder 20 (that is, in the state that the wafer W is stopped). The removal controller 116 controls the rinse liquid supply 60 to carry on the supply of the rinse liquid L3 while rotating the wafer W around the axis Ax which passes through a supply position of the rinse liquid L3. A time during which the removal controller 116 supplies the rinse liquid L3 may be longer than a time during which the acceleration controller 114 accelerates the volatilization of the solvent.

The removal controller 116 adjusts the rotation speed of the wafer W while supplying the rinse liquid L3 to replace the modifying liquid L2 on the wafer W with the rinse liquid L3. As an example, after the start of the supply of the rinse liquid L3, the removal controller 116 increases the rotation speed from zero to a rotation speed ω7 gradually and then increases the rotation speed from the rotation speed ω7 to a rotation speed ω8 rapidly, as illustrated in FIG. 5. A time during which the rotation speed is raised to the rotation speed ω7 from zero may be longer, e.g., twice to twenty times longer than a time during which the rotation speed is increased from the rotation speed ω7 to the rotation speed ω8. The rotation speed ω7 may be equal to the rotation speed ω1 (rotation speed ω3). The rotation speed ω8 may be equal to the rotation speed ω2 (rotation speed ω6).

The removal controller 116 controls the rotating holder 20 to change (reduce) the rotation speed of the wafer W from the rotation speed ω8 to a rotation speed ω9 until the supply of the rinse liquid L3 is ended. The removal controller 116 controls the rinse liquid supply 60 to stop the supply of the rinse liquid L3 at the moment when the rotation speed of the wafer W reaches the rotation speed ω9. The rotation speed ω9 is set in consideration of a processing to be performed after the end of the supply of the rinse liquid L3. As an example, the rotation speed ω9 is equal to the rotation speed ω3. In this case, the removal controller 116 controls the rotating holder 20 to change the rotation speed of the wafer W during the supply of the rinse liquid L3 such that the rotation speed of the wafer W at the end of the supply of the rinse liquid L3 and the rotation speed of the wafer W at the start of the supply of the modifying liquid L2 in a next cleaning processing are same. In the following, this control of changing the rotation speed of the wafer W from the rotation speed ω8 to the rotation speed ω3 during the supply of the rinse liquid L3 is referred to as "rotation speed change control."

The removal controller 116 may perform the rotation speed change control during the supply of the rinse liquid L3 in each of the multiple cycles of the cleaning processings. Alternatively, the removal controller 116 may perform the above-described rotation speed change control in at least one of the multiple cycles of the cleaning processings. In case that the removal controller 116 does not perform the above-described rotation speed change control, the modification controller 112 may adjust the rotation speed of the wafer W to the rotation speed ω1 by the rotating holder 20 before the next cleaning processing is begun after the end of supply of the rinse liquid L3.

Further, when the developing unit U3 has a nozzle for the rinse liquid different from the nozzle 62, the removal controller 116 may supply the rinse liquid L3 from the different nozzle for the rinse liquid in the multiple cycles of the cleaning processing. In the supply of the rinse liquid in the multiple cycles of the cleaning processings and in the supply of the rinse liquid prior to the multiple cycles of the cleaning processing, the control device 100 may supply the rinse liquid from the different rinse liquid nozzles (different rinse liquid supplies) or supply different kinds of rinse liquids therefrom.

The replacement controller 108 controls the developing unit U3 to replace the rinse liquid L3 on the front surface Wa of the wafer W with the solution L4 containing the surfactant before the front surface Wa of the wafer W on which the multiple cycles of the cleaning processing are performed is dried. The replacing of the rinse liquid L3 with the solution L4 includes a case where the rinse liquid L3 and the solution L4 coexist on the front surface Wa as at least a part of the rinse liquid L3 on the front surface Wa of the wafer W is removed. The replacement controller 108 controls the nozzle moving mechanism 76 to locate the nozzle 72 of the solution supply 70 on the axis Ax. The replacement controller 108 controls the solution supply 70 to supply the solution L4 onto the front surface Wa of the wafer W from the nozzle 72 on the axis Ax while rotating the wafer W by the rotating holder 20. The replacement controller 108 adjusts the rotation speed of the wafer W while supplying the solution L4 to replace the rinse liquid L3 on the wafer W with the solution L4. The replacement controller 108 carries on the supply of the solution L4 while rotating the wafer W at, for example, a rotation speed $\omega 10$. The rotation speed $\omega 10$ is set to allow the solution L4 to be diffused to the periphery of the wafer W. As an example, the rotation speed $\omega 10$ is equal to the rotation speed $\omega 5$.

To dry the front surface Wa of the wafer W (to remove the liquid filled in a recess of the resist pattern) after the cleaning controller 106 carries out the multiple cycles of the cleaning processing, the drying controller 110 controls the holder 22 to carry on the holding of the wafer W in the state that no liquid is supplied onto the wafer W. The drying controller 110 removes the solution L4 on the front surface Wa of the wafer W while rotating the wafer W at a rotation speed $\omega 11$ by the rotating holder 20, for example. The rotation speed $\omega 11$ is set to allow the solution L4 on the front surface Wa to be scattered off from the wafer W. As an example, the rotation speed $\omega 11$ is equal to the rotation speed $\omega 4$.

Figure 6:
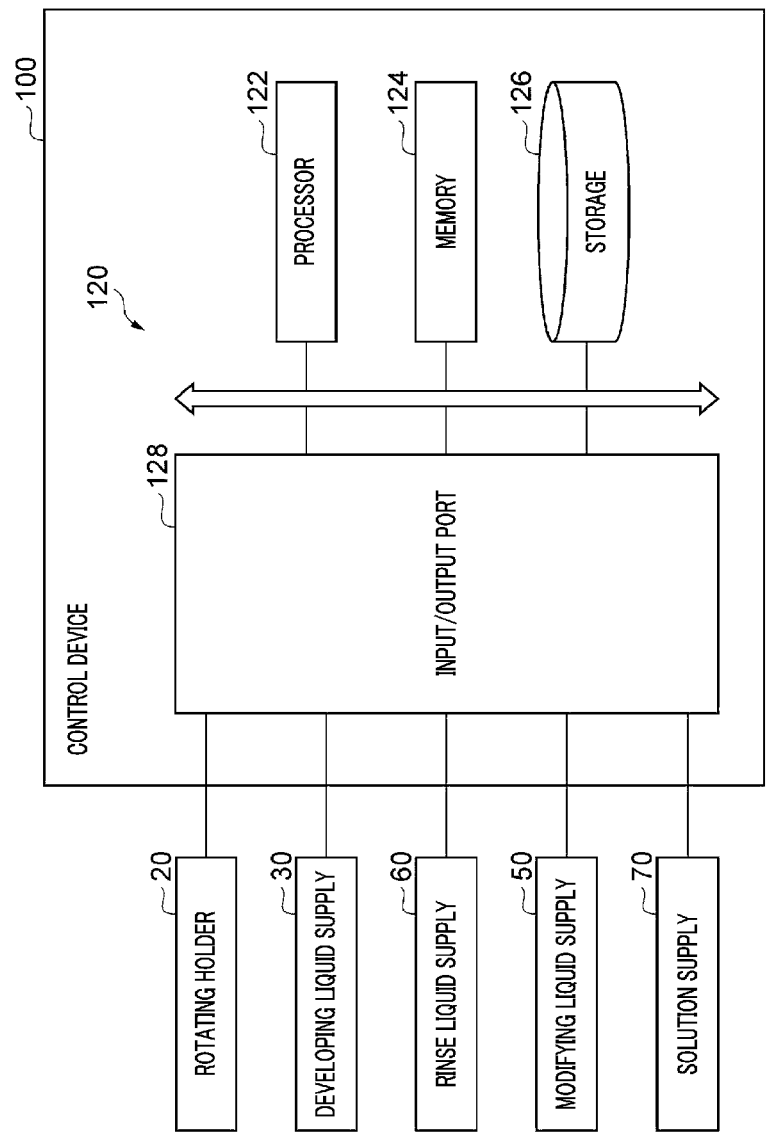
FIG. 6 is a block diagram illustrating an example hardware configuration of the control device.

The control device 100 is implemented by one or more control computers. As shown in FIG. 6, the control device 100 is equipped with a circuit 120. The circuit 120 includes one or more processors 122, a memory 124, a storage 126, and an input/output port 128. The storage 126 has a computer-readable recording medium such as, but not limited to, a hard disk. The recording medium stores therein programs that cause the control device 100 to implement a substrate processing sequence (developing processing sequence) to be described later. The recording medium may be a portable device such as a non-volatile semiconductor memory, a magnetic disk, or an optical disk. The memory 124 temporarily stores thereon the programs loaded from the recording medium of the storage 126 and an operation result by the processor 122. The processor 122 constitutes the aforementioned individual functional modules by executing the programs in cooperation with the memory 124. The input/output port 128 performs an input/output of an electric signal between control target members in response to an instruction from the processor 122.

In case that the control device 100 is implemented by the multiple control computers, the development controller 102, the rinsing controller 104, the cleaning controller 106 (the modification controller 112, the acceleration controller 114 and the removal controller 116), the replacement controller 108 and the drying controller 110 may be implemented by the individual control computers. Alternatively, each of these individual functional modules may be implemented by a combination of two or more control computers. In this case, the multiple control computers may implement the substrate processing sequence to be described later in an interconnected state so that they can communicate with each other. Further, the hardware configuration of the control device 100 is not limited to constituting the individual functional modules by the programs. By way of example, each functional module of the control device 100 may be implemented by a dedicated logic circuit or an ASIC (Application Specific Integrated Circuit) which is an integration of logic circuits.

[Substrate Processing Sequence]

Now, the substrate processing sequence implemented in the substrate processing system 1 will be explained as an example of a substrate processing method. The control device 100 controls the substrate processing system 1 to perform a substrate processing including a coating and developing processing in the following sequence, for example. First, the control device 100 controls the transfer device A1 to transfer a wafer W within the carrier C into the shelf unit U10, and controls the transfer device A7 to place this wafer W in a cell for the processing module 11.

Then, the control device 100 controls the transfer device A3 to carry the wafer W in the shelf unit 10 into the coating unit U1 and the heat treatment unit U2 within the processing module 11. Further, the control device 100 controls the coating unit U1 and the heat treatment unit U2 to form a bottom film on a front surface Wa of this wafer W. Then, the control device 100 controls the transfer device A3 to return the wafer W having the bottom film formed thereon into the shelf unit U10, and controls the transfer device A7 to place this wafer W in a cell for the processing module 12.

Subsequently, the control device 100 controls the transfer device A3 to transfer the wafer W within the shelf unit U10 into the coating unit U1 and the heat treatment unit U2 within the processing module 12. Further, the control device 100 controls the coating unit U1 and the heat treatment unit U2 to form a resist film R on the bottom film of the wafer W. Then, the control device 100 controls the transfer device A3 to return this wafer W into the shelf unit U10, and controls the transfer device A7 to place this wafer W in a cell for the processing module 13.

Thereafter, the control device 100 controls the transfer device A3 to transfer the wafer W within the shelf unit U10 into the individual units within the processing module 13. Further, the control device 100 controls the coating unit U1 and the heat treatment unit U2 within the processing module 13 to form a top film on the resist film R. Then, the control device 100 controls the transfer device A3 to transfer the wafer W into the shelf unit U11.

Next, the control device 100 controls the transfer device A8 to send the wafer W accommodated in the shelf unit U11 into the exposure apparatus 3. Then, an exposure processing is performed on the resist film R on the wafer W in the exposure apparatus 3. Then, the control device 100 controls the transfer device A8 to receive the wafer W after being subjected to the exposure processing from the exposure apparatus 3 and place the received wafer W in a cell for the processing module 14 in the shelf unit U11.

Afterwards, the control device 100 controls the transfer device A3 to transfer the wafer W within the shelf unit U11 into the heat treatment unit U4 of the processing module 14. Then, the control device 100 carries out a control to implement a processing sequence (hereinafter, referred to as "developing processing sequence") including a heat treatment involved in a developing processing, the developing processing and a rinsing processing. Accordingly, a resist pattern is formed on the front surface Wa of the wafer W. Details of the developing processing sequence will be elaborated later. Then, the control device 100 controls the transfer device A3 to return the wafer W after being subjected to the developing processing into the shelf unit U10, and controls the transfer device A7 and the transfer device A1 to return this wafer W into the carrier C. Through these operations, the coating and developing processing is completed.

(Developing Processing Sequence)

Figure 7:
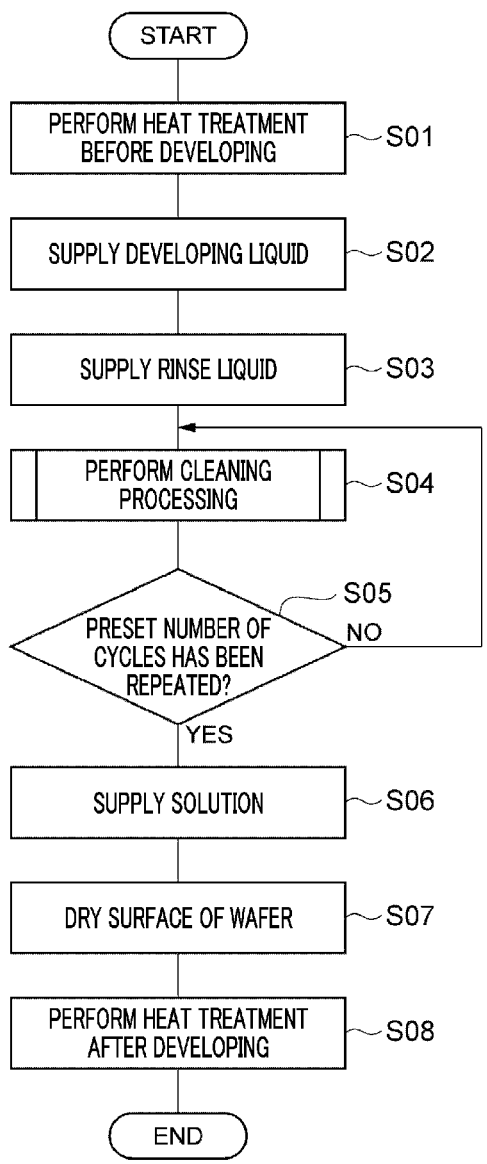
FIG. 7 is a flowchart illustrating an example of a developing processing sequence.

Now, referring to FIG. 7 to FIG. 10B, an example of the developing processing sequence will be elaborated. FIG. 7 is a flowchart illustrating the example of the developing processing sequence. First, the control device 100 performs a process S01. In the process S01, the control device 100, for example, controls the heat treatment unit U4 to perform a heat treatment on the wafer W after being subjected to the exposure processing at a preset temperature for a predetermined time. Then, the control device 100 controls the transfer device A3 to transfer this wafer W after being subjected to the heat treatment before the developing processing into the developing unit U3.

Then, the control device 100 performs a process S02. In the process S02, the development controller 102, for example, supplies the developing liquid L1 onto the front surface Wa of the wafer W by the developing liquid supply 30 in the state that the wafer W having the resist film R formed thereon is held by the holder 22. To elaborate, the development controller 102 controls the nozzle moving mechanism 36 to locate the nozzle 32 of the developing liquid supply 30 on the axis Ax. Then, the development controller 102 controls the developing liquid supply 30 to discharge the developing liquid L1 toward the front surface Wa of the wafer W having the resist film R thereon from the nozzle 32 on the axis Ax while rotating the wafer W by the rotating holder 20. After the developing liquid L1 is supplied, the development controller 102 may develop the resist film R by allowing the rotating holder 20 (holder 22) to carry on the holding of the wafer W in the state that the wafer W is stopped. As a result, the resist pattern is formed on the front surface Wa of the wafer W.

Thereafter, the control device 100 performs a process S03. In the process S03, the rinsing controller 104, for example, controls the rinse liquid supply 60 to supply the rinse liquid L3 onto the front surface Wa having the resist pattern formed thereon. To elaborate, the rinsing controller 104 controls the nozzle moving mechanism 66 to locate the nozzle 62 of the rinse liquid supply 60 on the axis Ax. Then, the rinsing controller 104 controls the rinse liquid supply 60 to supply the rinse liquid L3 onto the front surface Wa of the wafer W from the nozzle 62 on the axis Ax while rotating the wafer W by the rotating holder 20. The rinsing controller 104 may control the rotating holder 20 to change the rotation speed while supplying the rinse liquid L3. For example, the rinsing controller 104 controls the rotating holder 20 to rotate the wafer W at the rotation speed $\omega 1$ at the start of the supply of the rinse liquid L3 and then increase the rotation speed of the wafer W to the rotation speed $\omega 2$ after the start of the supply of the rinse liquid L3. Then, the rinsing controller 104 controls the rotating holder 20 to decrease the rotation speed of the wafer W gradually from the rotation speed $\omega 2$ to the rotation speed $\omega 3$. Then, if the rotation speed of the wafer W reaches the rotation speed $\omega 3$, the rinsing controller 104 controls the rinse liquid supply 60 to stop the supply of the rinse liquid L3.

Subsequently, the control device 100 performs processes S04 and S05. In the processes S04 and S05, the cleaning controller 106, for example, performs multiple cycles of cleaning processing. A specific example of the multiple cycles of the cleaning processing (cleaning processing sequence) will be elaborated later. After the cleaning controller 106 carries out the multiple cycles of the cleaning processing, the rinse liquid L3 remains on the front surface Wa of the wafer W (in the recess of the resist pattern).

After the preset number of cycles of the cleaning processing is performed, the control device 100 performs a process S06. In the process S06, the replacement controller 108, for example, controls the developing unit U3 to replace the rinse liquid L3 on the front surface Wa of the wafer W after being subjected to the preset number of cycles of the cleaning processing with the solution L4 containing the surfactant. To elaborate, the replacement controller 108 controls the nozzle moving mechanism 76 to locate the nozzle 72 of the solution supply 70 on the axis Ax. Then, the replacement controller 108 controls the solution supply 70 to supply the solution L4 onto the front surface Wa of the wafer W from the nozzle 72 on the axis Ax while rotating the wafer W at the rotation speed $\omega 10$ by the rotating holder 20. The replacement controller 108 may carry on the supply of the solution L4 for a predetermined time set to allow the solution L4 to be diffused onto the entire front surface Wa of the wafer W in a substantially uniform manner, and may control the solution supply 70 to stop the supply of the solution L4 after a lapse of the predetermined time.

Next, the control device 100 performs a process S07. In the process S07, the drying controller 110, for example, dries the front surface Wa of the wafer W held by the holder 22 (removes the liquid filled in the recess of the resist pattern). To be specific, the drying controller 110 removes the solution L4 on the front surface Wa of the wafer W while rotating the wafer W at the rotation speed $\omega 11$ by rotating holder 20. The drying controller 110 may carry on the rotation of the wafer W for a preset time which is set such that the liquid (solution L4) is not left on the front surface Wa, and may control the rotating holder 20 to stop the rotation of the wafer W after a lapse of the preset time.

Then, the control device 100 performs a process S08. In the process S08, the controller device 100, for example, controls the heat treatment unit U4 to perform a heat treatment on the wafer W having the resist pattern thereon at a preset temperature for a predetermined time. Accordingly, the heat treatment after the developing processing is performed, and the developing processing sequence is finally ended.

(Cleaning Processing Sequence)

Figure 8:
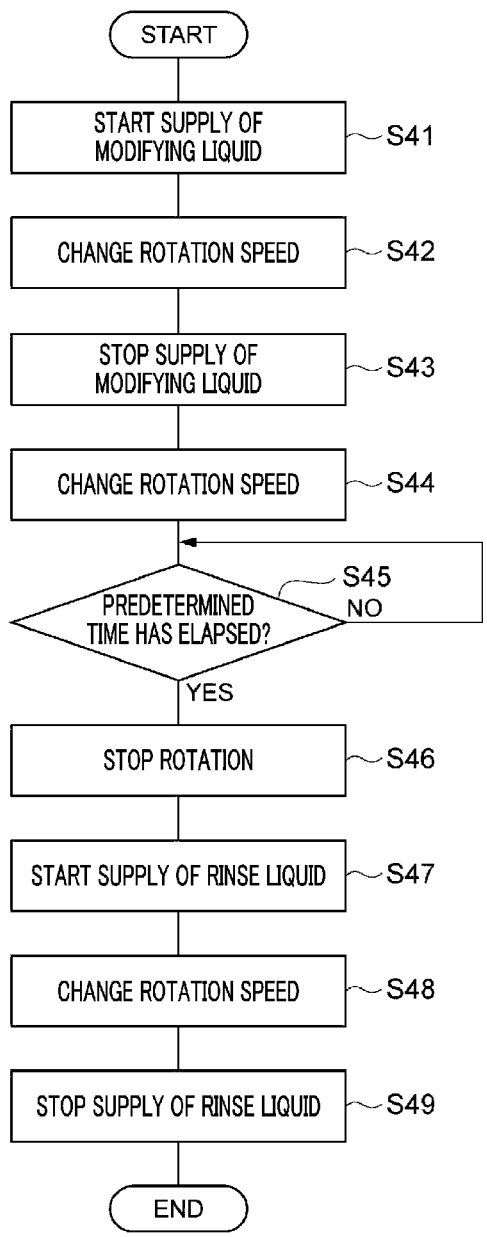
FIG. 8 is a flowchart illustrating an example of a cleaning processing sequence.
Figure 9A:
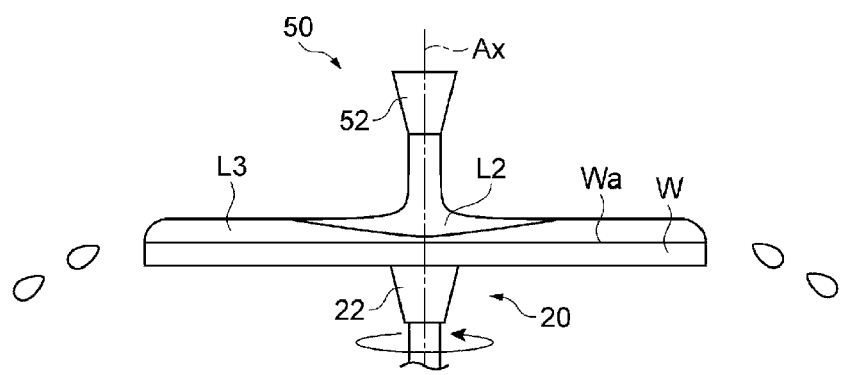
FIG. 9A and FIG. 9B are schematic diagrams for describing a supply of a modifying liquid in the cleaning processing sequence.

FIG. 8 is a flowchart illustrating an example of the cleaning processing sequence. In this cleaning processing sequence, the control device 100 performs a process S41 in the state that the rotation of the wafer W by the rotating holder 20 at the rotation speed $\omega 3$ is continued. In the process S41, the modification controller 112, for example, controls the modifying liquid supply 50 to start the supply of the modifying liquid L2 onto the front surface Wa of the wafer W which is being rotated at the rotation speed $\omega 3$. To be specific, as depicted in FIG. 9A, the modification controller 112 controls the nozzle moving mechanism 56 to locate the nozzle 52 of the modifying liquid supply 50 on the axis Ax and then controls the modifying liquid supply 50 to start the supply of the modifying liquid L2.

Subsequently, the control device 100 performs processes S42 and S43. In the process S42, the modification controller 112, for example, controls the rotating holder 20 to increase the rotation speed of the wafer W from the rotation speed $\omega 3$ to the rotation speed $\omega 4$. Accordingly, as shown in FIG. 9A, the rinse liquid L3 is gradually removed (gradually replaced by the modifying liquid L2) as the modifying liquid L2 is diffused. In the process S43, the modification controller 112 controls the modifying liquid supply 50 to stop the supply of the modifying liquid L2.

Figure 9B:
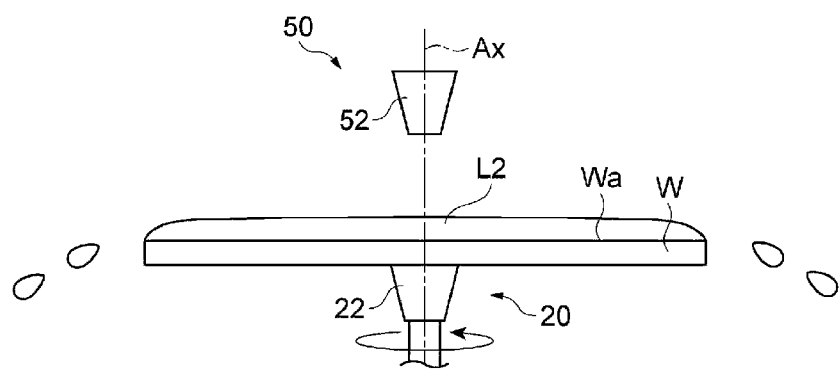

Afterwards, the control device 100 performs processes S44 and S45. In the process S44, the acceleration controller 114, for example, controls the rotating holder 20 to decrease the rotation speed of the wafer W from the rotation speed $\omega 4$ to the rotation speed ω5. Then, the acceleration controller 114 controls the rotating holder 20 to increase the rotation speed of the wafer W from the rotation speed ω5 to the rotation speed ω6. Thereafter, as shown in FIG. 9B, the acceleration controller 114 controls the rotating holder 20 to keep on rotating the wafer W at the rotation speed ω6. Specifically, the acceleration controller 114 allows the wafer W to be kept being rotated at the rotation speed ω6 until a predetermined time elapses. The predetermined time is set to be of a value during which the concentration of the modifying agent in the modifying liquid L2 is increased such that the modifying liquid L2 is not solidified. The predetermined time may be in a range from, for example, several seconds to several tens of seconds.

Figure 10A:
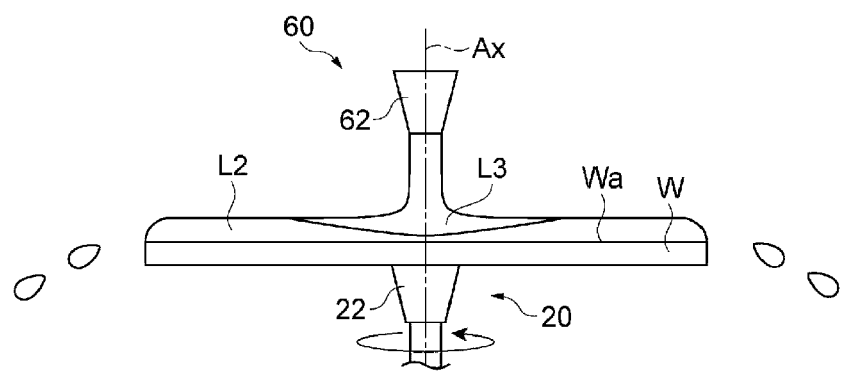

After the lapse of the predetermined time, the control device 100 performs processes S46 and S47. In the process S46, the removal controller 116 controls the rotating holder 20 to stop the rotation of the wafer W (render the rotation speed zero). In the process S47, the removal controller 116, for example, controls the rinse liquid supply 60 to start the supply of the rinse liquid L3 in the state that the rotation speed of the wafer W is set to zero (in the state that the wafer W is stopped). To be specific, as illustrated in FIG. 10A, the removal controller 116 controls the nozzle moving mechanism 66 to locate the nozzle 62 of the rinse liquid supply 60 on the axis Ax. Then, the removal controller 116 controls the rinse liquid supply 60 to supply the rinse liquid L3 from the nozzle 62 on the axis Ax onto the front surface Wa of the wafer W held by the rotating holder 20.

Figure 10B:
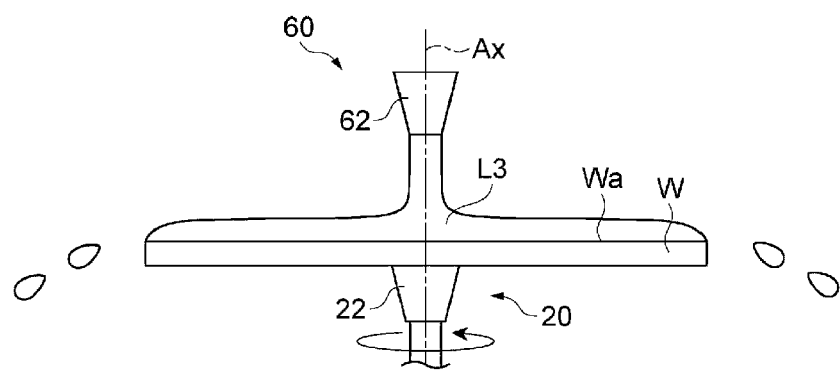

Subsequently, the control device 100 performs processes S48 and S49. In the process S48, the removal controller 116, for example, controls the rotating holder 20 to resume the rotation of the wafer W and change the rotation speed. As an example, the removal controller 116 accelerates the rotation of the wafer W gradually up to the rotation speed ω7 and then raises the rotation speed of the wafer W from the rotation speed ω7 to the rotation speed ω8 rapidly. Accordingly, as shown in FIG. 10B, the modifying liquid L2 on the front surface Wa of the wafer W is replaced by the rinse liquid L3 (that is, the modifying liquid L2 is removed). Then, the removal controller 116 gradually decreases the rotation of the wafer W from the rotation speed ω8 to the rotation speed ω9 (rotation speed ω3). In the process S49, the removal controller 116, for example, controls the rinse liquid supply 60 to stop the supply of the rinse liquid L3.

After the completion of the first cycle of the cleaning processing including the above-described processes S41 to S49, the control device 100 repeats the processes S41 to S49. Further, the acceleration controller 114 may perform the acceleration of the volatilization of the solvent in the processes S44 and S45 in each of the multiple cycles of the cleaning processing, or perform the processes S44 and S45 in some of the multiple cycles of the cleaning processing. Alternatively, the control device 100 may omit the processes S44 and S45 in each of the multiple cycles of the cleaning processing.

Effects of Exemplary Embodiments

As stated above, the above-described substrate processing sequence includes supplying the developing liquid L1 for forming the resist pattern onto the front surface Wa of the wafer Won which the resist film R is formed; performing multiple times the cleaning processing of supplying the modifying liquid L2 containing the modifying agent having the hydrophilic group onto the front surface Wa of the wafer W having the resist pattern formed thereon and supplying the rinse liquid L3 for removing the modifying liquid L2 onto the front surface Wa of the wafer W; and drying the front surface Wa of the wafer W after performing the cleaning processing multiple times.

The substrate processing system 1 is equipped with the holder 22 configured to hold the wafer W; the developing liquid supply 30 configured to supply the developing liquid L1 for forming the resist pattern onto the front surface Wa of the wafer W on which the resist film R is formed; the modifying liquid supply 50 configured to supply the modifying liquid L2 containing the modifying agent having the hydrophilic group onto the front surface Wa of the wafer W on which the resist pattern is formed; the rinse liquid supply 60 configured to supply the rinse liquid L3 for removing the modifying liquid L2 onto the front surface Wa of the wafer W; the development controller 102 configured to supply the developing liquid L1 onto the front surface Wa of the wafer W by the developing liquid supply 30 in the state that this wafer W is held by the holder 22; the cleaning controller 106 configured to perform the multiple cycles of the cleaning processing of supplying the modifying liquid L2 onto the front surface Wa of the wafer W by the modifying liquid supply 50 and supplying the rinse liquid L3 onto the front surface Wa of the wafer W by the rinse liquid supply 60 in the state that the wafer W is held by the holder 22; and the drying controller 110 configured to allow, after the cleaning controller 106 performs the multiple cycles of the cleaning processing, the holder 22 to carry on the holding of wafer W in the state that no liquid is supplied onto the wafer W, to thereby dry the front surface Wa of the wafer W.

When drying the front surface Wa of the wafer W, if a contact angle between the liquid on the front surface Wa and the surface of the resist pattern is large, a liquid fracture may be made as a part of a lump of the liquid is separated when the liquid is removed from the front surface Wa. If this liquid fracture is made, the liquid remains in the recess of a part of the resist pattern, resulting in a pattern collapse due to a surface tension of the remaining liquid at that point. In the above-described method (the above-described substrate processing system 1), the modifying liquid L2 is supplied multiple times through the multiple cycles of the cleaning processing, so that the surface of the resist pattern is modified. Accordingly, a likelihood of the liquid fracture when the liquid is removed from the wafer W is reduced. Therefore, the pattern collapse of the resist pattern can be suppressed. Further, since the supply of the modifying liquid L2 and the removal of the corresponding modifying liquid L2 with the rinse liquid L3 are repeated multiple times, a dissolution product generated in the developing processing can be removed.

Figure 11A:
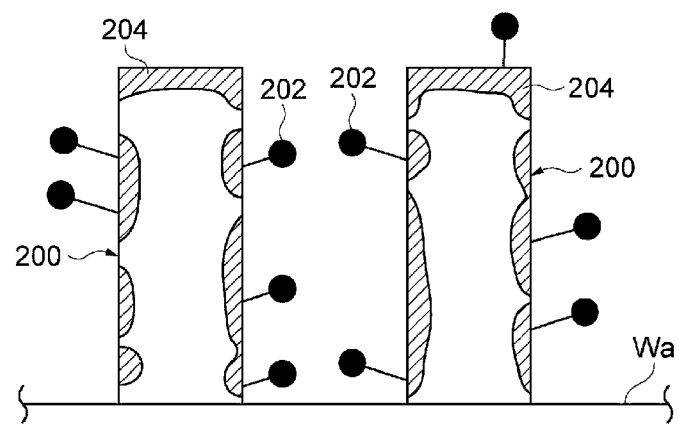
FIG. 11A and FIG. 11B are schematic diagrams illustrating a state of a reaction on a surface of a resist pattern caused by the modifying liquid.
Figure 11B:
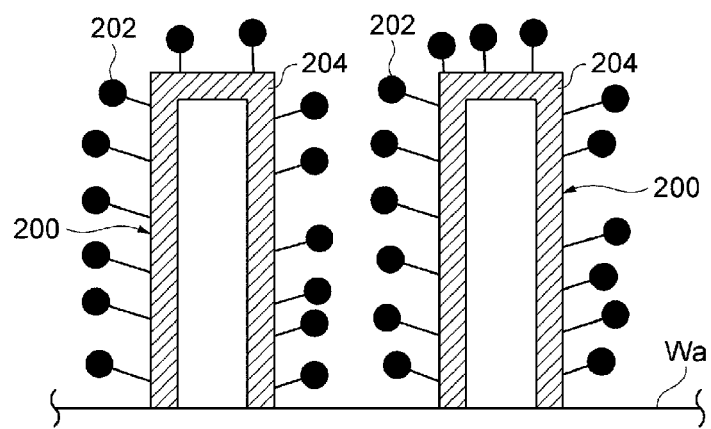

FIG. 11A and FIG. 11B schematically illustrate the modification of the surface of the resist pattern by the modifying liquid L2. FIG. 11A illustrates a state of the front surface Wa upon the completion of the first cycle of the cleaning processing, and FIG. 11B shows a state of the front surface Wa upon the completion of the second or more cycles (multiple cycles) of the cleaning processing. As depicted in FIG. 11A, in the first cycle of the cleaning processing, it is deemed that the surface of a resist pattern 200 and a hydrophilic group 202 in the modifying liquid L2 react with each other, so that a modified layer 204 is formed at this reaction portion of the resist pattern 200. At this time, the modified layer 204 is formed on the resist pattern 200 in a sparse state. Here, the sparse state refers to a state in which a surface area of the modified layer 204 with respect to the entire surface area of the resist pattern 200 is small. In this sparse state, the modified layer 204 is not uniformly formed on the surface of the resist pattern 200.

If the second or more cycles of the cleaning processing are performed after the modified layer 204 is formed on the surface of the resist pattern 200 in the sparse state, the modified layer 204 is formed on the resist pattern 200 in a dense state, as shown in FIG. 11B. Here, the dense state refers to a state in which the surface area of the modified layer 204 with respect to the entire surface area of the resist pattern 200 is large. It is deemed that, in the second or more cycles of the cleaning processing, since the modified layer 204 is already formed at a part of the resist pattern 200 in the cleaning processing(s) previously performed, the modifying agent may permeate into an unreacted portion of the resist pattern 200 to hydrophilize that portion. Accordingly, the modified layer 204 is uniformly formed on the surface of the resist pattern 200, and a thickness of the modified layer 204 is increased. It is deemed that, since the modified layer 204 is uniformly formed on the surface of the resist pattern 200 including an exposed portion between the resist patterns 200 on the front surface Wa (base film), generation of the liquid fracture is suppressed when the liquid is removed from the front surface Wa. Further, when the contact angles are different at the resist pattern 200 and the exposed portion of the base film, it is more advantageous to form the modified layer 204 uniformly.

The modifying agent may contain water-soluble polymer. Since the water-soluble polymer includes a number of hydrophilic groups, the modification of the surface of the resist pattern can be carried out efficiently.

At least one cycle of the cleaning processing may further include increasing the concentration of the modifying agent before supplying the rinse liquid L3 and after supplying the modifying liquid L2 onto the front surface Wa of the wafer W. In this case, as the concentration of the modifying agent is increased, the modification of the contact angle at the surface of the resist pattern progresses more securely. Therefore, the pattern collapse of the resist pattern can be suppressed more effectively.

Increasing the concentration of the modifying agent may include accelerating the volatilization of the solvent in the modifying agent L2. In this case, the concentration of the modifying agent in the modifying liquid L2 can be increased with a simple device.

Supplying the rinse liquid L3 onto the front surface Wa of the wafer W may include starting the supply of the rinse liquid L3 onto the front surface Wa of the wafer W in the state that the wafer W is stopped and continuing the supply of the rinse liquid L3 while rotating the wafer W. If the supply of the rinse liquid L3 is started in the state that the wafer W is rotated, a lump of the rinse liquid L3 adhering to the front surface Wa of the wafer W at the start of the supply of the rinse liquid L3 is scattered as the wafer W is rotated. Accordingly, a liquid amount diffused to the periphery of the wafer W becomes non-uniform in a circumferential direction of the substrate, resulting in non-uniformity in the removal of the modifying liquid L2. Meanwhile, in this method, since the wafer W is stopped, the scattering of the lump of the rinse liquid L3 adhering to the front surface Wa scarcely occurs, so it is effective to suppress the non-uniformity in the removal of the modifying liquid L2.

Supplying the modifying liquid L2 onto the front surface Wa of the wafer W may include supplying the modifying liquid L2 while rotating the wafer W. Supplying the rinse liquid L3 while rotating the wafer W may include changing the rotation speed of the wafer W during the supply of the rinse liquid L3 so that the rotation speed of the wafer W at the end of the supply of the rinse liquid L3 and the rotation speed of the wafer W at the start of the modifying liquid L2 in the next cycle of the cleaning processing are same. In this case, a time required to adjust the rotation speed of the wafer W between the supply of the rinse liquid L3 and the next cycle of the cleaning processing can be saved. Accordingly, it is possible to improve a throughput while suppressing the pattern collapse.

The above-stated processing sequence may further include replacing the rinse liquid L3 on the front surface Wa of the wafer W with the solution L4 containing the surfactant before drying the front surface Wa of the wafer W after being subject to the multiple cycles of the cleaning processing. Since the surface tension of the solution L4 is small, the pattern collapse is suppressed even if a part of this solution L4 remains between the patterns in the drying processing. Further, since the modification progresses on the surface of the resist pattern through the multiple cycles of the cleaning processing, the replacement of the rinse liquid L3 by the solution L4 can be carried out more securely. Therefore, the pattern collapse can be further suppressed.

In the above-described substrate processing sequence, the modifying liquid L2 may be supplied from the same nozzle 52 and the rinse liquid L3 may be supplied from the same nozzle 62 in the multiple cycles of the cleaning processing. In this case, the devices for supplying the modifying liquid L2 and the rinse liquid L3 can be simplified.

In the above-described substrate processing sequence, the multiple cycles of the cleaning processing may be performed in the state that the wafer W is placed at the same position. In this case, a time required to transfer the wafer W between the multiple cycles of the cleaning processing can be saved. Therefore, it is possible to improve a throughput while suppressing the pattern collapse.

So far, the exemplary embodiments have been described. However, the present disclosure is not limited to the above-described exemplary embodiments, and various changes and modifications may be made without departing from the scope of the present disclosure. The substrate as the processing target object is not limited to the semiconductor wafer and may be, by way of non-limiting example, a glass substrate, a mask substrate, a FPD (Flat Panel Display), or the like.

According to the exemplary embodiment, it is possible to provide the substrate processing method capable of suppressing a collapse of the resist pattern, a recording medium and a substrate processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing method, comprising:
supplying a developing liquid configured to form a resist pattern onto a surface of a substrate on which a resist film is formed;
performing multiple cycles of a cleaning processing of supplying a modifying liquid containing a modifying agent having a hydrophilic group onto the surface of the substrate on which the resist pattern is formed and supplying a rinse liquid configured to remove the modifying liquid onto the surface of the substrate; and drying the surface of the substrate after performing the multiple cycles of the cleaning processing, wherein the supplying of the rinse liquid onto the surface of the substrate includes:

starting a supply of the rinse liquid onto the surface of the substrate in a state that the substrate is stopped; and continuing the supply of the rinse liquid while rotating the substrate, wherein during the supplying of the modifying liquid, rotating the substrate at a first speed then rotating the substrate at a second speed that is higher than the first speed, and wherein during the supplying of the rinse liquid, rotating the substrate at a rotation speed of zero, then rotating the substrate at a third speed that is higher than zero, and then rotating the substrate at a fourth speed that is higher than the third speed.

2. The substrate processing method of claim 1, wherein the modifying agent contains a water-soluble polymer.

3. The substrate processing method of claim 1, wherein at least one cycle of the cleaning processing further includes increasing a concentration of the modifying agent before the supplying of the rinse liquid and after the supplying of the modifying liquid onto the surface of the substrate.

4. The substrate processing method of claim 3, wherein the increasing of the concentration of the modifying agent includes accelerating volatilization of a solvent of the modifying liquid.

5. The substrate processing method of claim 1, wherein the supplying of the rinse liquid while rotating the substrate includes changing a rotation speed of the substrate during the supply of the rinse liquid such that the rotation speed of the substrate at an end of the supply of the rinse liquid and the rotation speed of the substrate at a beginning of the supplying of the modifying liquid in a next cycle of the cleaning processing are same.

6. The substrate processing method of claim 1, further comprising:

replacing the rinse liquid on the surface of the substrate with a solution containing a surfactant before drying the surface of the substrate on which the multiple cycles of the cleaning processing are performed.

7. The substrate processing method of claim 1, wherein the modifying liquid is supplied from a same modifying liquid nozzle and the rinse liquid is supplied from a same rinse liquid nozzle in the multiple cycles of the cleaning processing.

8. The substrate processing method of claim 1, wherein the multiple cycles of the cleaning processing are performed in a state that the substrate is placed at a same position.

9. A computer-readable recording medium having stored thereon computer-executable instructions that, in response to execution, cause an apparatus to perform a substrate processing method as claimed in claim 1.

10. A substrate processing apparatus, comprising:

a holder configured to hold a substrate;

a developing liquid supply configured to supply a developing liquid for forming a resist pattern onto a surface of the substrate on which a resist film is formed;

a modifying liquid supply configured to supply a modifying liquid containing a modifying agent having a hydrophilic group onto the surface of the substrate on which the resist pattern is formed;

a rinse liquid supply configured to supply a rinse liquid for removing the modifying liquid onto the surface of the substrate;

a development controller configured to control the developing liquid supply to supply the developing liquid onto the surface of the substrate in a state that the substrate is held by the holder;

a cleaning controller configured to perform multiple cycles of a cleaning processing of supplying the modifying liquid by the modifying liquid supply and supplying the rinse liquid by the rinse liquid supply onto the surface of the substrate in the state that the substrate is held by the holder; and a drying controller configured to allow, after the cleaning controller performs the multiple cycles of the cleaning processing, the holder to carry on a holding of the substrate in a state that no liquid is supplied, to thereby dry the surface of the substrate, wherein the cleaning controller comprises a removal controller, wherein the removal controller is configured to:

control the rinse liquid supply to start a supply of the rinse liquid onto the surface of the substrate in a state that the substrate is stopped, control the rinse liquid supply to continue the supply of the rinse liquid while rotating the substrate, during the supply of the modifying liquid, rotate the substrate at a first speed then rotate the substrate at a second speed that is higher than the first speed, and during the supply of the rinse liquid, rotate the substrate at a rotation speed of zero, then rotate the substrate at a third speed that is higher than zero, and then rotate the substrate at a fourth speed that is higher than the third speed.

* * * * *

UNITED STATES PATENT AND TRADEMARK OFFICE
CERTIFICATE OF CORRECTION

PATENT NO. : 11,848,189 B2
APPLICATION NO. : 17/009834
DATED : December 19, 2023
INVENTOR(S) : Takahiro Shiozawa et al.

It is certified that error appears in the above-identified patent and that said Letters Patent is hereby corrected as shown below:

In the Specification

Column 2, Line 14, "FIG. 1013" should be -- FIG. 10B --.

Signed and Sealed this
Sixth Day of August, 2024

Katherine Kelly Vidal
Director of the United States Patent and Trademark Office